United States Patent [19]
Kokubo

[11] Patent Number: 6,072,739
[45] Date of Patent: Jun. 6, 2000

[54] SEMICONDUCTOR MEMORY DEVICE CAPABLE OF ATTAINING HIGHER SPEED DATA READING AND WRITING OPERATIONS BY MAKING EQUALIZATION OPERATION SUITABLE FOR SINGLE DATA LINE

[75] Inventor: Nobuyuki Kokubo, Hyogo, Japan

[73] Assignee: Mitsubishi Denki Kabushiki Kaisha, Tokyo, Japan

[21] Appl. No.: 09/286,458

[22] Filed: Apr. 6, 1999

[30] Foreign Application Priority Data

Nov. 2, 1998 [JP] Japan .................................. 10-311952

[51] Int. Cl.[7] ...................................................... G11C 7/00
[52] U.S. Cl. ........................................ 365/203; 365/230.03
[58] Field of Search ............................... 365/203, 230.03, 365/189.01, 230.01

[56] References Cited

U.S. PATENT DOCUMENTS 4,860,257  8/1989  Choi .................................... 365/189.11
5,901,086  5/1999  Wang et al. ........................ 365/185.21
5,907,516  5/1999  Kwon et al. ........................... 365/203

FOREIGN PATENT DOCUMENTS 60-242585  12/1985  Japan .
63-288497  11/1988  Japan .
6-342597  12/1994  Japan .
10-21686   1/1998   Japan .
10-106266  4/1998   Japan .

Primary Examiner—David Nelms
Assistant Examiner—Hoai V. Ho
Attorney, Agent, or Firm—McDermott, Will & Emery

[57] ABSTRACT

A semiconductor memory device of the present invention includes a data bus and an I/O line which are hierarchically provided data lines. In accordance with a column selection operation, storage data in a memory cell is transmitted from the I/O line through a data bus driver to the data bus. Prior to the column selection operation, the data bus is equalized by an equalization circuit. The equalization circuit includes an equalization capacitor for holding in advance a potential corresponding to an inverted state of the data bus, and a transistor gate for connecting the equalization capacitor and the data bus.

5 Claims, 6 Drawing Sheets

SEMICONDUCTOR MEMORY DEVICE CAPABLE OF ATTAINING HIGHER SPEED DATA READING AND WRITING OPERATIONS BY MAKING EQUALIZATION OPERATION SUITABLE FOR SINGLE DATA LINE

BACKGROUND OF THE INVENTION

1. Field of the Invention

The present invention relates to semiconductor memory devices and more particularly to a structure of a semiconductor memory device capable of attaining higher speed data reading and writing operations 2. Description of the Background Art Due to the recent demand for higher speed and larger capacity semiconductor memory devices, there is a need to increase the data capacity that can be handled in unit time.

In order to attain higher speed data reading and writing operations, it is necessary to cause data lines (hereinafter, signal lines that transmit storage data having two states of H and L levels are collectively referred to as data lines), which tend to have larger parasitic capacitance due to their design and operate slowly as a result, to operate at high speed. Accordingly, such a method of attaining higher speed reading and writing operations is generally adopted that is intended to shorten the time necessary to charge and discharge a data line by transmitting storage data after setting in advance the potential of the data line to an intermediate value of the potentials (hereinafter, referred to as an intermediate potential) corresponding to the two logical levels of the storage data.

The above described data line is often provided as a pair of complementary lines. Since the complementarily provided lines of the data line pair have almost equal parasitic capacitance and receive data having their logical levels inverted from each other, the both lines can be set to an equal potential (that is, an intermediate potential) by simply short-circuiting them (hereinafter, the operation of setting the potential of a data line at a prescribed value by short-circuiting a data line and another data line or the like is generally referred to as an equalization operation).

The equalization operation of such a data line pair provided as complementary lines is described, for example, in Japanese Patent Laying-Open Nos. 60-242585 and 06-342597.

One specific example of attaining higher speed data reading and writing operations is the method of sequentially changing only column addresses while the same row address is selected thereby attaining higher speed column accessing. In this case as well, the operation speed is made much higher by waiting for data line selection after equalizing in advance an input/output signal line, to which data is read, in response to an address transition detection signal (hereinafter, referred to as an ATD signal) that is produced by an address transition detection circuit (ATD; Address Transition Detector) when the circuit detects transition of external input addresses.

Since the equalization operation is a useful technique for attaining an higher speed operation as described above, it may be necessary that even data line that is not complementarily provided has its data line potential set to a prescribed intermediate potential, prior to transmission of storage data, by applying the equalization operation. Equalization circuits having a structure as described below have conventionally been used in this case.

Figure 10:
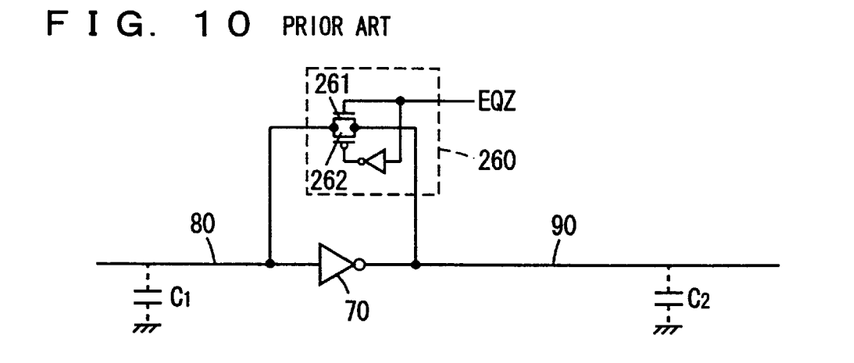
FIGS. 10 and 11 are schematic diagrams showing structures of equalization circuits 260 and 360 in the conventional art.

FIG. 10 is a circuit diagram showing a structure of an equalization circuit 260 in a conventional art (hereinafter, referred to as the first conventional art).

Referring to FIG. 10, the I/O line 80 and the data bus 90 representatively show two data lines that are directly connected from a group of hierarchically provided data lines. Equalization circuit 260 is provided to apply the equalization operation to data bus 90 in response to an equalization signal EQZ. I/O line 80 is connected to the output node of a sense amplifier for amplifying storage data in a memory cell in accordance with a column selection operation corresponding to a column address. A data bus driver (inverter) 70 inverts data on the I/O line and transmits it to data bus 90.

Since a global data line is generally larger in interconnection length and width, the parasitic capacitance C1 of I/O line 80 and the parasitic capacitance C2 of data bus 90 have the relationship of C2>>C1. In this case, it is important to carry out data transmission after data bus 90 having larger parasitic capacitance is set to a prescribed potential to attain a higher speed operation.

Equalization circuit 260 includes an n-channel transistor 261 receiving equalization signal EQZ at its gate and connecting I/O line 80 and data bus 90, and a p-channel transistor 262 receiving a signal /EQZ, as an inversion signal of EQZ, at its gate and connecting I/O line 80 and data bus 90. In response to activation of signal EQZ, equalization circuit 260 short-circuits I/O line 80 and data bus 90, each of which transmits data having an opposite state from each other, and sets data bus 90 to an intermediate potential.

Figure 11:
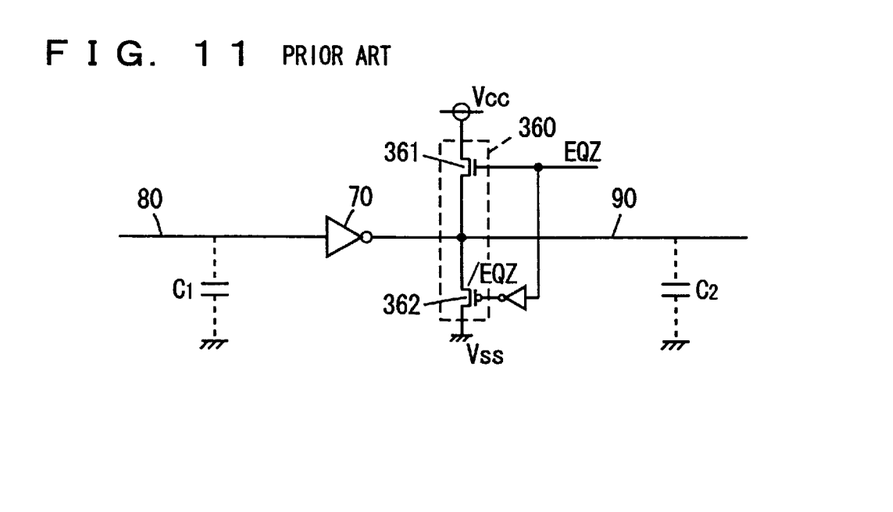

FIG. 11 is a circuit diagram showing a structure of an equalization circuit 360 in another conventional art (hereinafter, referred to as the second conventional art). Since I/O line 80 and data bus 90 are the same as FIG. 8, the description thereof will not be repeated.

Referring to FIG. 11, equalization circuit 360 includes an n-channel transistor 361 receiving equalization signal EQZ at its gate and connecting data bus 90 and a Vcc power supply for supplying a potential (hereinafter, referred to as Vcc) corresponding to the H level of storage data, and a p-channel transistor 362 receiving signal /EQZ as an inversion signal of EQZ at its gate and connecting data bus 90 and a Vss power supply for supplying a potential (hereinafter, referred to as Vss) corresponding to the L level of storage data.

In response to activation of the equalization signal, equalization circuit 360 short-circuits the data bus, the Vcc power supplly and the Vss power supply, and sets the potential of data bus 90 to the vicinity of ½ Vcc.

However, parasitic capacitance C1 of I/O line 80 and parasitic capacitance C2 of data bus 80 are substantially different in equalization circuit 260 in the first conventional art. Accordingly, even when the I/O line and the data bus are connected by equalization circuit 260, the potential of data bus 90 cannot be set to the vicinity of ½ Vcc, and the higher operation speed cannot fully be attained.

In equalization circuit 360 in the second conventional art, data bus 90 can be set to the potential in the vicinity of ½ Vcc by short-circuiting data bus 90 between the Vcc power supply and the Vss power supply. However, a current flows through the path from Vcc power supply, to n-channel transistor 361, to p-channel transistor 362, and then to the Vss power supply during the equalization operation, and thus unnecessary power loss is caused.

SUMMARY OF THE INVENTION

An object of the present invention is to attain higher speed reading and writing operations in semiconductor memory devices.

In summary, the present invention provides a semiconductor memory device transmitting and receiving storage data having two logical levels of H and L levels, including a memory cell array, a first data line, and an equalization circuit, wherein the memory cell array has a plurality of memory cells arranged in rows and columns, the first data line transmits storage data in a memory cell, and the equalization circuit sets the first data line to a prescribed potential prior to transmission of the storage data, and includes an equalization capacitor for holding a potential corresponding to the inverted logical level of the first data line, and a switch circuit for connecting the first data line and the equalization capacitor.

According to another aspect of the present invention, a semiconductor memory device transmitting and receiving storage data includes a memory cell array and an equalization circuit, wherein the memory cell array has first and second memory mats one of which is selected in a mutually exclusive way, each of the first and second memory mats has a plurality of memory cells arranged in rows and columns and a first data line for transmitting storage data stored in the memory cells, the equalization circuit for setting the first data lines of the first and the second memory mats at a prescribed potential has a switch circuit for connecting the first data line of the first memory mat and the first data line of the second memory mat, a first transfer circuit for driving a potential level of the first data line in the second memory mat to a level corresponding to an inverted logical level of the first data line in the first memory mat while the first memory mat is selected, and a second transfer circuit for driving a potential level of the first data line in the first memory mat to a level corresponding to an inverted logical level of the first data line in the second memory mat while the second memory mat is selected.

Accordingly, a major advantage of the present invention is that the data reading operation can be performed at higher speed by applying the equalization operation to a data line, which is not complementarily provided, prior to the data reading operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described below in detail with reference to the drawings. In the drawings, the same reference character designates the same or corresponding parts.

First Embodiment

Figure 1:
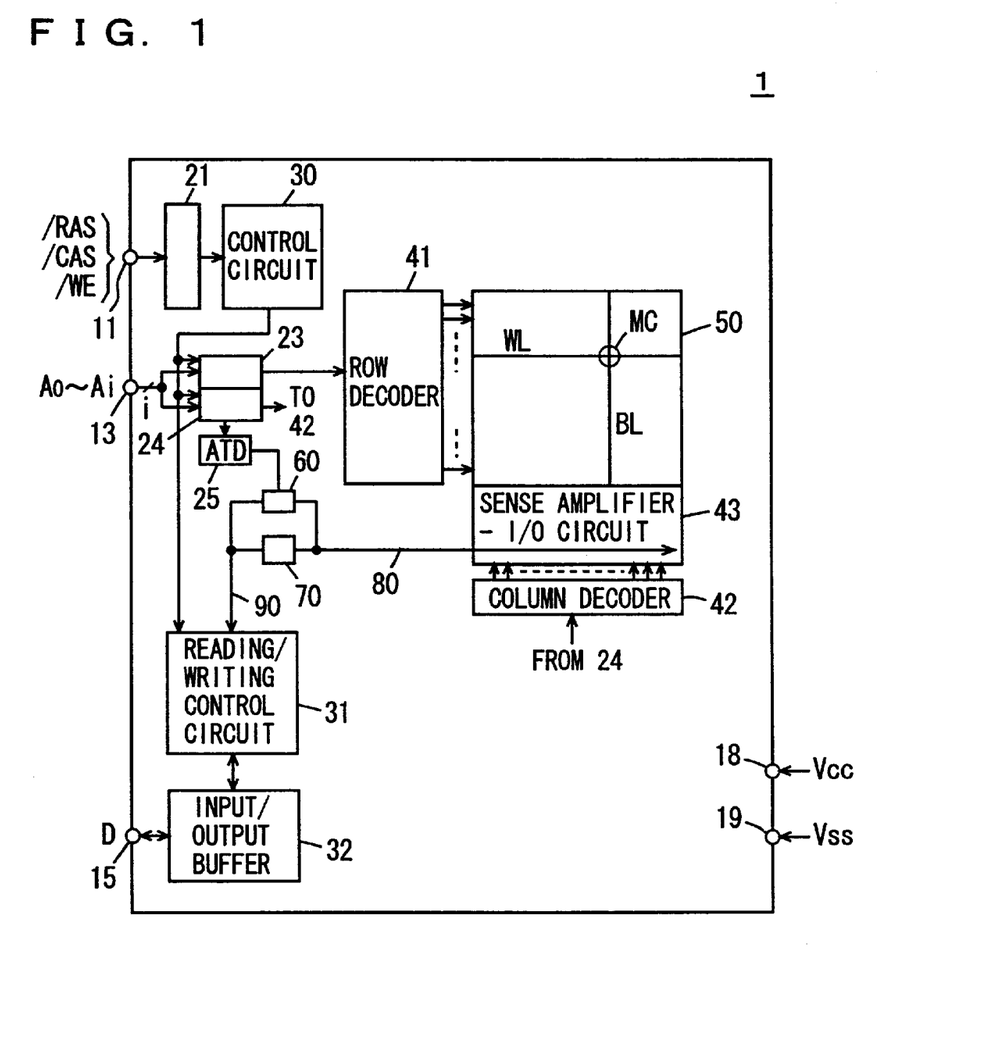
FIG. 1 is a schematic block diagram showing an overall structure of a semiconductor memory device 1 in a first embodiment of the present invention.

FIG. 1 is a schematic block diagram showing an overall structure of a semiconductor memory device 1 in a first embodiment of the present invention.

Referring to FIG. 1, semiconductor memory device 1 includes a control circuit 30 receiving external control signals such as /RAS, /CAS and /WE, which are supplied through a control signal input terminal 11, thorough a control signal buffer 21 for controlling the operation of the entire semiconductor memory device 1, row and column address buffers 23 and 24 receiving address signals from an address signal input terminal 13 in accordance with instructions from control circuit 30 for producing internal address signals, an address transition detection circuit (ATD) 25 for detecting switching of column address signals, and a memory cell array 50 having memory cells MC arranged in rows and columns.

Memory cell MC is connected to a word line WL provided in each row of memory cell array 50 and to a bit line BL provided in each column. Word line WL is selectively activated by a row decoder 41 in response to a row address signal. A corresponding column selection line CSL (not shown) is selectively activated by a column decoder 42 in response to a column address signal. When bit line BL is connected to a sense amplifier —I/O circuit 43, data in memory cell MC is read to an I/O line 80.

The data read to I/O line 80 is transmitted to a data bus 90 by a data bus driver 70. Data bus 90 transmits and receives data to and from a reading/writing control circuit 31. When an instruction is given from control circuit 30, reading/writing control circuit 31 outputs the read data through an input/output buffer 32 to an input/output terminal 15.

In the writing operation, data supplied through input/output terminal 15 is stored in memory cell MC by reversing the series of operations above. By these operations, transmission and reception of storage data are carried out through input/output terminal 15 in accordance with the external control signals and the address signals.

Semiconductor memory device 1 further includes a Vcc power supply terminal 18 receiving a potential Vcc and a Vss power supply terminal 19 receiving a potential Vss. It is noted that Vcc may be generated by newly providing a voltage conversion circuit inside.

Semiconductor memory device 1 is provided with an equalization circuit 60 for carrying out an equalization operation for data bus 90, which has large parasitic capacitance, in response to an ATD signal output from address transition detection circuit 25. Accordingly, higher speed data reading and writing operations are attained by setting data bus 90 to a prescribed potential prior to the reading and writing operations.

Figure 2:
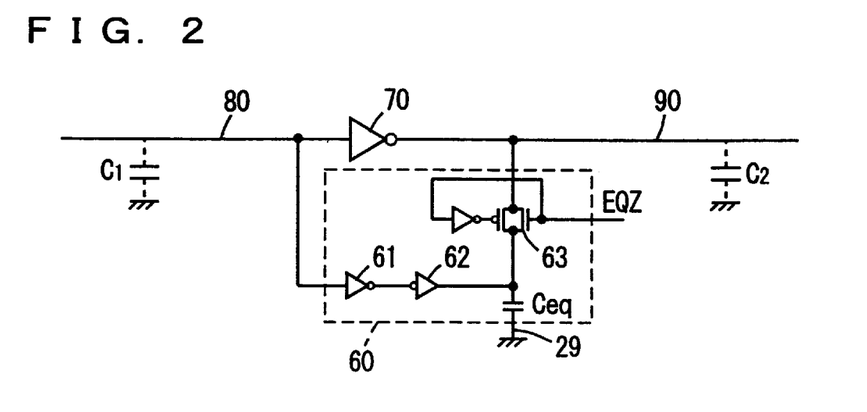
FIG. 2 is a schematic diagram showing a structure of the circuit associated with he equalization operation of semiconductor memory device 1.

FIG. 2 is a schematic diagram showing a structure of the circuit related to the equalization operation of semiconductor memory device 1. In FIG. 2, the equalization operation carried out prior to the reading operation will be described.

Referring to FIG. 2, equalization circuit 60 is provided to equalize data bus 90 in response to an equalization signal EQZ.

Similarly to the prior art, I/O line 80 and data bus 90 representatively show two data lines that sequentially transmit the same data from a group of hierarchically provided data lines. Here, I/O line 80 is connected to the output node of the sense amplifier for amplifying storage data in a memory cell in accordance with the column selection operation corresponding to the column address.

A data bus driver (inverter) 70 inverts data on I/O line 80 and transmits it to data bus 90. Similarly to the prior art, the parasitic capacitance C1 of I/O line 80 and the parasitic capacitance C2 of data bus 90 have the relationship of C2>>C1. Accordingly, it is important, for higher speed operations, to carry out data transmission after data bus 90, which has large parasitic capacitance, is set to a prescribed potential.

Equalization circuit 60 includes an inverter 61 for inverting the state of I/O line 80, an inverter 62 for inverting the output of inverter 61, an equalization capacitor Ceq connected between the output node of inverter 62 and a Vss power supply line 29, and a transistor gate 63 connected between the output node of inverter 62 and data bus 90.

Transistor gate 63 has an n-channel transistor receiving equalization signal EQZ at its gate and connecting equalization capacitor Ceq and data bus 90, and a p-channel transistor receiving a signal /EQZ as an inversion of equalization signal EQZ at its gate and connecting data bus 90 and Ceq.

Before transistor gate 63 is turned on by equalization signal EQZ, a potential corresponding to the state opposite from that of data bus 90 is held in capacitor Ceq by inverters 61, 62. Thereafter, in response to activation of equalization signal EQZ, transistor gate 63 is turned on, and equalization capacitor Ceq and data bus 90 are short-circuited. Thus, potential Veq after the equalization operation of data bus 90 attains $Veq = Ceq/(C2+Ceq) \cdot Vcc$.

In other words, by providing equalization circuit 60 to have such a structure, the potential of data bus 90 after the equalization operation can accurately be determined by the setting of the capacitance of equalization capacitor Ceq.

When the capacitance of equalization capacitor Ceq is set to be equal to the capacitance of data bus 90 (Ceq=C2), the potential of data bus 90 after equalization can be set to ½ Vcc. Further, the potential of data bus 90 after equalization can freely be set by the capacitance of equalization capacitor Ceq. Thus, when the potential after precharging is intentionally set to be shifted from ½ Vcc toward Vcc or Vss, such an equalization operation can be made possible that emphasizes the response speed to either the H or L level of data.

Since an unnecessary current does not flow to the inverters in equalization circuit 60, unnecessary power loss can be avoided.

Figure 3:
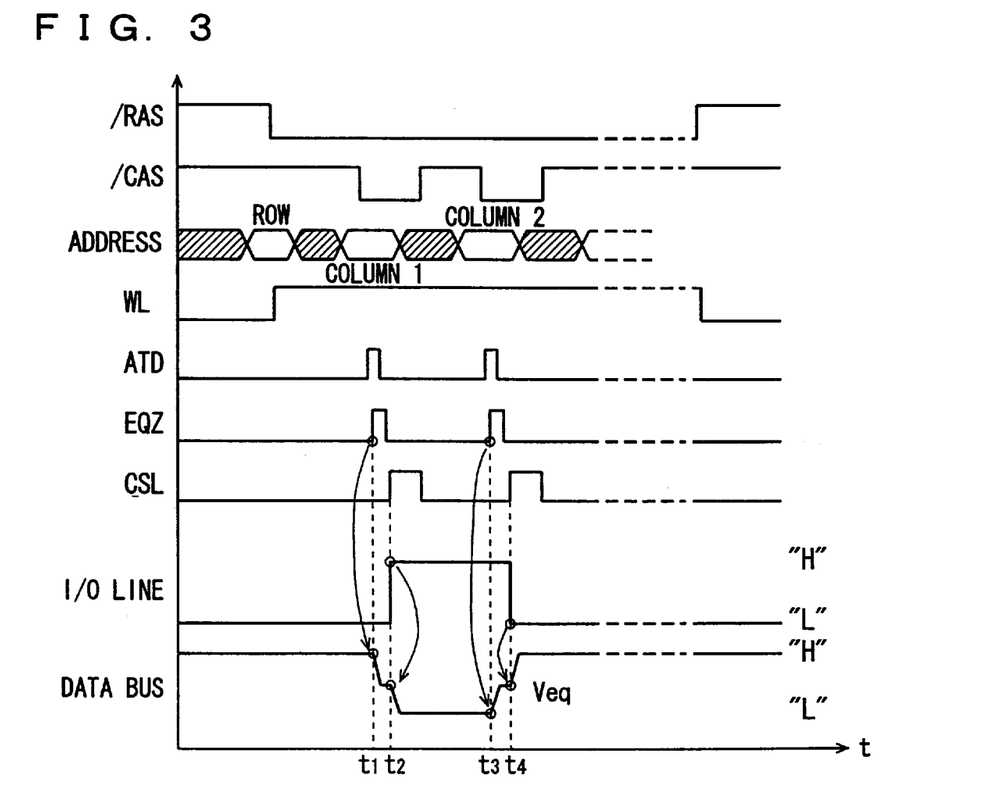
FIG. 3 is a waveform chart of signal and data lines for describing the equalization operation of semiconductor memory device 1.

FIG. 3 is a waveform chart showing the states of signal and data lines during the equalization operation.

Referring to FIG. 3, equalization during the reading operation in semiconductor memory device 1 will be described. First, in response to activation of row address strobe signal /RAS, which is an externally supplied control signal, an operation for selecting a row of the memory cell array is activated, and word line WL corresponding to a designated row address is activated. Then, column address strobe signal /CAS, which is also externally supplied, is activated, a corresponding column address is designated, and circuits for column selection are activated.

In order to transmit and receive data at high speed, the column access mode is adopted in which only column addresses are changed while the same row address is kept. Specifically, under the condition that signal /RAS is once activated and a row address is designated, signal /CAS is repeatedly activated and inactivated to successively designate different column addresses.

In order to attain higher speed column addressing in that mode, one-shot pulse type signal ATD is produced by an address transition detection circuit when it detects switching of column addresses.

In response to production of signal ATD, the data bus, which has large parasitic capacitance, is set to an intermediate potential by regarding signal ATD as an internal clock before storage data corresponding to the changed address is read to the data line.

In other words, equalization signal EQZ is activated at time t1 when signal ATD is activated for the first time. In response to activation of equalization signal EQZ, the data bus is equalized and set to an intermediate potential Veq. After the operation is completed, at time t2, the column selection operation corresponding to a column address is carried out and, in response to activation of column selection line CSL, data in a memory cell (at the H level, in this case) is read to the I/O line and transmitted through data bus driver 70 to the data bus.

At time t3 when the column addresses are changed, equalization signal EQZ is similarly activated corresponding to signal ATD, and the potential of the data bus is set to intermediate potential Veq again prior to the column selection operation. After the potential of the data bus is set to Veq, at time t4, the column selection operation is carried out, and data in a corresponding memory cell ( at the L level, in this case) is read to the I/O line and transmitted through data bus driver 70 to the data bus.

As described above, the higher speed column access operation is attained by shortening the time necessary to charge and discharge the data bus when the state of storage data is inverted from the H level to the L level or from the L level to the H level.

A specific method of implementing equalization capacitor Ceq included in equalization circuit 60 will be described below.

Figure 4:
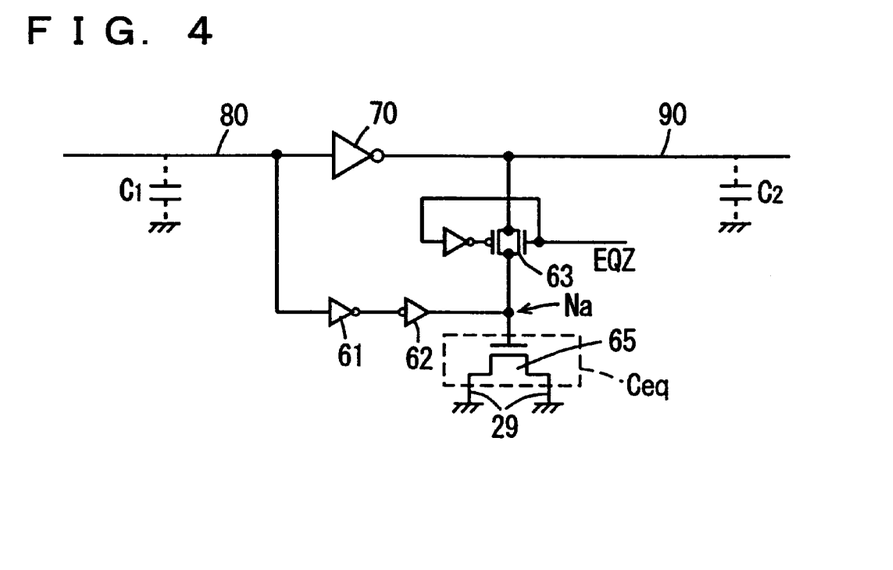
FIGS. 4 and 5 are circuit diagrams showing first and second specific implementations of equalization capacitor Ceq.

FIG. 4 is a circuit diagram showing a first specific implementation of equalization capacitor Ceq.

Referring to FIG. 4, equalization capacitor Ceq includes an MOS transistor 65 having a gate connected to the output node Na of inverter 62 and a source and a drain connected to Vss power supply line 29. Since Ceq is obtained as a parallel-plane capacitor according to such a structure, accurate capacitance can be obtained. Accordingly, desired capacitance can accurately be set by regulating the number of MOS transistors to be connected in parallel.

Figure 5:
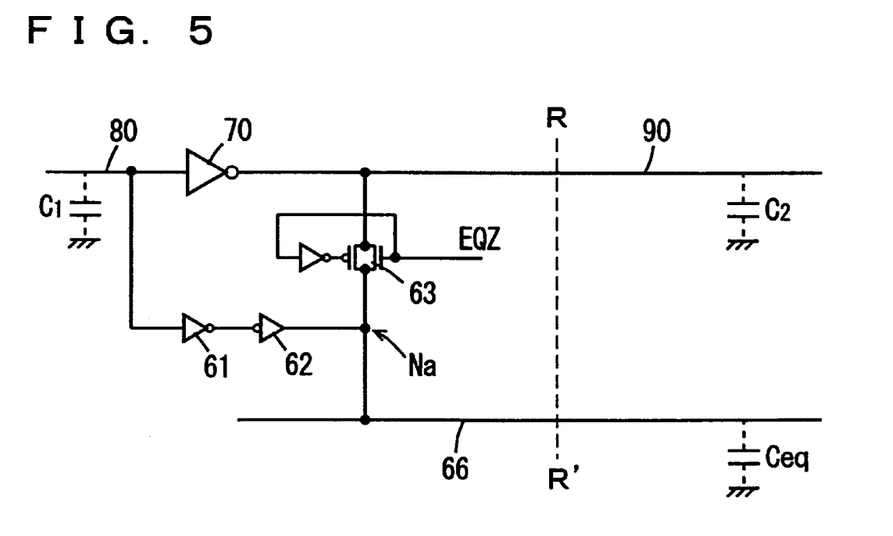
Figure 6:
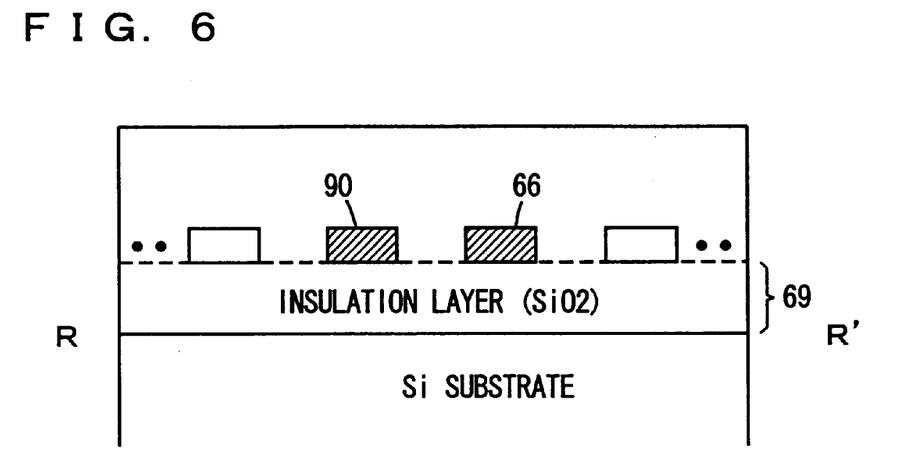
FIG. 6 is a cross sectional diagram taken along line R-R' in FIG. 5.

FIG. 5 is a circuit diagram for describing a second specific implementation of equalization capacitor Ceq. FIG. 6 is a cross sectional diagram showing the R-R' cross section in FIG. 5.

Referring to FIG. 5, equalization capacitor Ceq includes a metal line 66 connected to node Na which in turn is connected to data bus 90 through transistor gate 63. By providing metal line 66 and data bus 90 as lines designed to have the same specification on the same interlevel dielectric layer 69 as shown in FIG. 6, a capacitor having the same capacitance and frequency characteristics as parasitic capacitance C2 of data bus 90 can be obtained as equalization capacitor Ceq.

Figure 7:
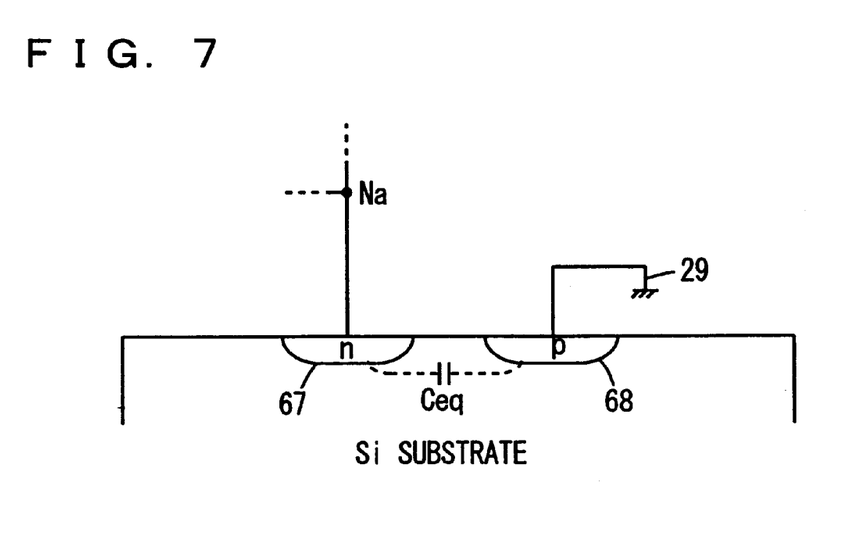
FIG. 7 is a conceptual diagram showing a third specific implementation of equalization capacitor Ceq.

FIG. 7 is a conceptual diagram for describing a third specific implementation of equalization capacitor Ceq. In FIG. 7, connection from I/O line 80 and data bus 90 to node Na and the components thereof are the same as FIGS. 4 and 5.

Referring to FIG. 7, equalization capacitor Ceq has an n type region 67 connected to node Na and a p type region 68 connected to Vss power supply line 68. Here, n and p type regions 67 and 68 are provided on a silicon substrate at which semiconductor memory device 1 is formed. Ceq is formed of a p-n junction capacitor that is formed between n and p type regions 67 and 68. According to such a structure, there is a layout advantage that Ceq can be formed directly on the silicon substrate without newly providing a region in which a transistor and a metal wire are formed.

Second Embodiment

In a second embodiment, a more effective data bus equalization operation is aimed in a case in which the memory cell array is divided into a plurality of memory cell blocks.

Figure 8:
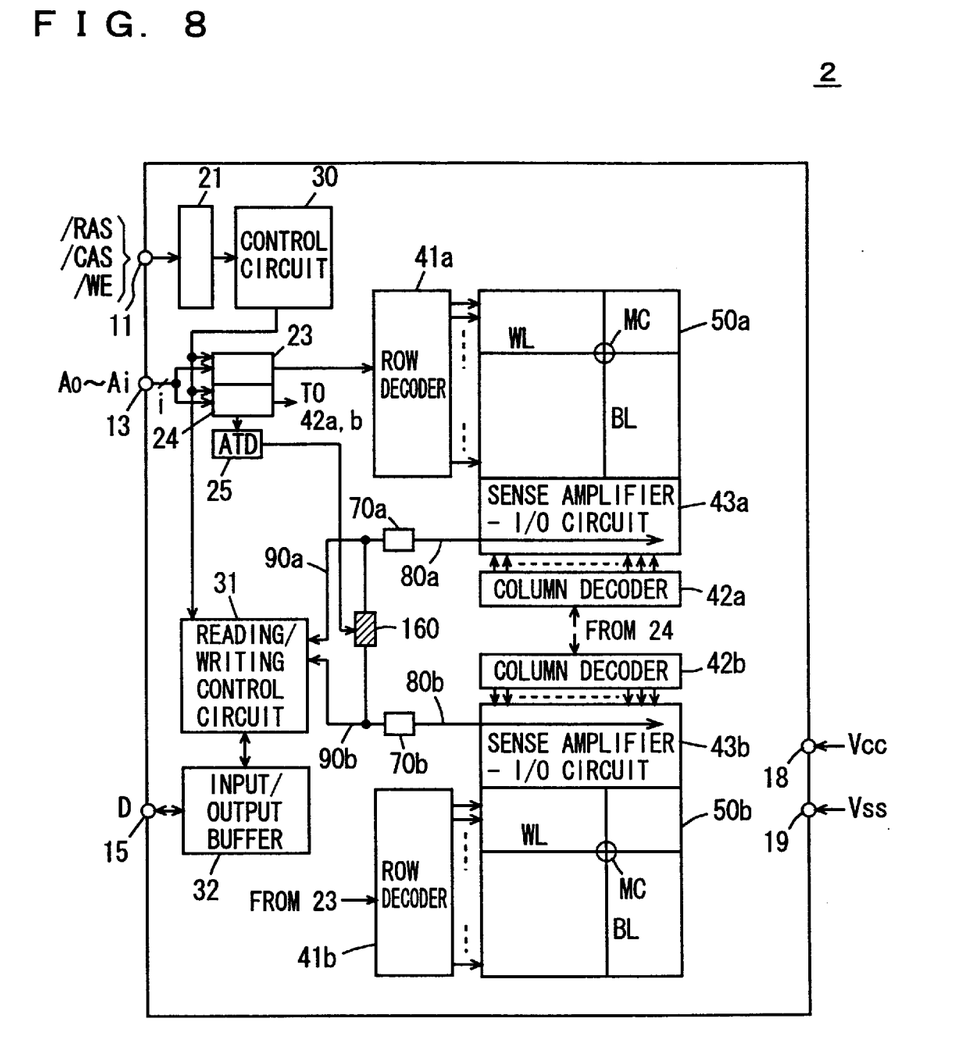
FIG. 8 is a schematic block diagram showing an overall structure of a semiconductor memory device 2 in a second embodiment of the present invention.

FIG. 8 is a schematic block diagram showing an overall structure of a semiconductor memory device 2 in the second embodiment of the present invention. In FIG. 8 as well, equalization prior to the reading operation will be described.

In the second embodiment, a case in which the memory cell array is divided into two memory cell blocks 50a and 50b will be considered as an example. Hereinafter, memory cell block 50a is referred to as a memory mat #0 and memory cell block 50b as a memory mat #1. In semiconductor memory device 2, memory mats #0 and #1 are activated complementarily. In other words, memory mat #0 is selected when memory mat #1 is not selected, and memory mat #0 is not selected when memory mat #1 is selected.

In contrast with semiconductor memory device 1 in FIG. 1, semiconductor memory device 2 has row decoders 41a, 41b, column decoders 42a, 42b, sense amplifier—I/O circuits 43a, 43b, data bus drivers 70a, 70b, I/O lines 80a, 80b, and data buses 90a, 90b provided corresponding to respective memory cell blocks. Further, data buses 90a, 90b are equalized by an equalization circuit 160 commonly provided for memory blocks #0, #1 in semiconductor memory device 2. Since other structure and operation are similar to those of semiconductor memory device 1, the description thereof will not be repeated.

Figure 9:
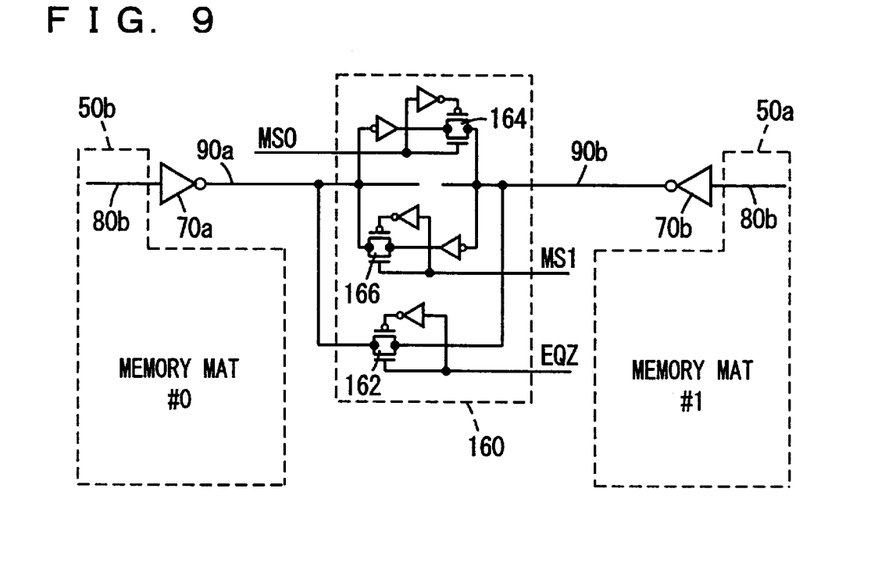
Fig. 9 is schematic gram showing a structure of the circuit associated with the equalization operation of semiconductor memory device 2 in the second embodiment of the present invention.

FIG. 9 is a schematic diagram for describing a structure of the circuit associated with the equalization operation in semiconductor memory device 2 in the second embodiment.

The data bus is provided to be divided into data bus 90a corresponding to memory mat #0 and data bus 90b corresponding to memory mat #1. In each memory mat, data on I/O lines 80a, 80b is transmitted to data buses 90a, 90b by data bus drivers 70a, 70b.

Since memory mats #0 and #1 are complementarily activated, memory mat #1 is not selected and data bus 90b is not used when memory mat #0 is selected. Similarly, when memory mat #1 is selected, memory mat #0 is not selected and data bus 90a is not used.

Equalization circuit 160 includes three transistor gates 162, 164, 166. Transistor 162 is formed of an n-channel transistor receiving equalization signal EQZ at its gate and a p-channel transistor receiving signal /EQZ at its gate, and transistor gate 162 short-circuits data bus 90a and data bus 90b in response to activation of signal EQZ.

Transistor gate 164 is formed of an n-channel transistor receiving a memory mat selection signal MS0 at its gate, which is activated when memory mat #0 is selected, and a p-channel transistor receiving signal /MS0 at its gate, and transistor gate 164 transmits the inverted logical level of data bus 90a to data bus 90b in response to activation of signal MS0. Transistor gate 166 has a similar structure, and it transmits the inverted logical level of data bus 90b to data bus 90a in response to activation of a memory mat selection signal MS1.

According to the structure, when memory mat #0 is selected, for example, data having a state opposite from that of data bus 90a of memory mat #0 can be stored on data bus 90b of memory mat #1. It is assumed that equalization signal EQZ is activated and data buses 90a, 90b are short-circuited by transistor gate 162 in this situation. When data buses 90a, 90b are designed to have the same size, they have almost equal parasitic capacitance, and therefore the potential of data bus 90a is set to ½ Vcc. When memory mat #1 is selected, the potential of data bus 90b can also be set to ½ Vcc by a similar operation.

In the second embodiment as well, the timing for producing equalization signal EQZ can be considered similarly, and the higher speed data reading operation can be attained by initiating data transmission after applying the equalization operation to data buses 90a, 90b.

When memory mat #1 is selected, transistor switch 164 also serves to prevent the logical level of data bus 90a of memory mat #0 from being stored on data bus 90b of memory mat #1. This holds true to transistor gate 166.

Although the case in which a memory cell array is divided into two memory mats has been described in the second embodiment, this embodiment can also be applied to a case in which the memory cell array is divided into a larger number of memory mats. Similar effects to those of the second embodiment can be attained in the memory cell array that are divided into a larger number of memory cell blocks by providing a data bus for each divided memory cell block and providing a similar equalization circuit 160 for every two memory cell blocks that are selected complementarily (at least, they are not selected at the same time).

Although the equalization operation during data reading has been described in the first and second embodiments, data line equalization can be carried out by a similar procedure and the higher speed data writing operation can be attained during data writing, as well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device transmitting and receiving storage data, comprising:

a) a memory cell array including first and second memory mats one of which is selected in a mutually exclusive way, each of said first and second memory mats having a plurality of memory cells arranged in rows and columns, and a first data line for transmitting storage data stored in said memory cells;

and b) an equalization circuit for setting said first data lines of said first and said second memory mats at a prescribed potential, said equalization circuit including a switch circuit for connecting said first data line of said first memory mat and said first data line of said second memory mat, a first transfer circuit for driving a potential level of said first data line in said second memory mat to a level corresponding to an inverted logical level of said first data line in said first memory mat while said first memory mat is selected, and a second transfer circuit for driving a potential level of said first data line in said first memory mat to a level corresponding to an inverted logical level of said first data line in said second memory mat while said second memory mat is selected.

2. The semiconductor memory device according to claim 1, wherein said first data line of said first memory mat is equal to said first data line of said second memory mat in parasitic capacitance.

3. The semiconductor memory device according to claim 1, wherein each of said memory mats further includes a sense amplifier for amplifying the storage data in said memory cell, a second data line connected to said sense amplifier, a third transfer circuit for driving a potential level of said first data line to a level corresponding to a logical level of said second data line, and a reading control circuit for reading out said storage data transmitted from said first data line.

4. The semiconductor memory device according to claim 3, wherein said first data line is larger than said second data line in parasitic capacitance.

5. The semiconductor memory device according to claim 1, further comprising a control circuit for producing first and second control signals, wherein the storage data in said memory cell is transmitted to said first data line in response to activation of said first control signal, said second control signal is activated for a prescribed time period prior to activation of said first control signal, and said switch circuit connects said first data line of said first memory mat and said first data line of said second memory mat in response to activation of said second control signal.

* * * * *